(12) United States Patent
Li et al.

(10) Patent No.: US 11,849,558 B2
(45) Date of Patent: Dec. 19, 2023

(54) SERVER CHASSIS AND SERVER INCLUDING THE SAME

(71) Applicant: Fulian Precision Electronics (Tianjin) Co., LTD., Tianjin (CN)

(72) Inventors: Yang Li, Tianjin (CN); Han-Yu Li, New Taipei (TW); Ya-Ni Zhang, Tianjin (CN); Li Hou, Tianjin (CN)

(73) Assignee: Fulian Precision Electronics (Tianjin) Co., LTD., Tianjin (CN)

( * ) Notice: Subject to any disclaimer, the term of this patent is extended or adjusted under 35 U.S.C. 154(b) by 0 days.

(21) Appl. No.: 17/726,682

(22) Filed: Apr. 22, 2022

(65) Prior Publication Data

US 2022/0386498 A1 Dec. 1, 2022

(30) Foreign Application Priority Data

May 26, 2021 (CN) .......................... 202110578649.1

(51) Int. Cl.
H05K 7/14 (2006.01)

(52) U.S. Cl.
CPC ......... H05K 7/1489 (2013.01); H05K 7/1407 (2013.01); H05K 7/1418 (2013.01); H05K 7/1487 (2013.01)

(58) Field of Classification Search
CPC . G06F 1/18; G06F 1/187; G06F 1/184; G11B 33/12; G11B 33/124; G11B 33/128; H05K 7/14; H05K 7/1407; H05K 7/1418; H05K 7/1487; H05K 7/1489; H05K 7/18
See application file for complete search history.

(56) References Cited

U.S. PATENT DOCUMENTS

| | | | | |
|---|---|---|---|---|
| 9,167,716 B2* | 10/2015 | Ma | ...................... | H05K 7/1489 |
| 9,974,202 B1* | 5/2018 | Good | ................... | A47B 88/975 |
| 2005/0219833 A1* | 10/2005 | Wu | ........................ | G06F 1/187 |
| | | | | 361/829 |
| 2008/0310123 A1* | 12/2008 | Sherrod | ............... | H05K 7/1488 |
| | | | | 361/725 |
| 2009/0147452 A1* | 6/2009 | Zhang | ..................... | G06F 1/181 |
| | | | | 361/679.02 |
| 2013/0009529 A1* | 1/2013 | Zhu | ........................ | G06F 1/187 |
| | | | | 312/223.2 |
| 2013/0258620 A1* | 10/2013 | Qiu | ...................... | G11B 33/128 |
| | | | | 361/759 |
| 2017/0020018 A1* | 1/2017 | Chen | ..................... | H05K 7/1417 |
| 2020/0183466 A1* | 6/2020 | Chen | ..................... | G11B 33/128 |
| | | | | 361/759 |
| 2021/0219451 A1* | 7/2021 | Yang | ..................... | H05K 7/1488 |
| 2022/0350935 A1* | 11/2022 | Strickland | ............... | G06F 30/17 |

FOREIGN PATENT DOCUMENTS

| | | |
|---|---|---|
| CN | 103365373 A | 10/2013 |
| CN | 205681731 U | 11/2016 |

* cited by examiner

*Primary Examiner* — Adrian S Wilson
*Assistant Examiner* — Gage Crum
(74) *Attorney, Agent, or Firm* — ScienBiziP, P.C.

(57) ABSTRACT

A server chassis includes a housing, a support frame, and a back plate. The housing includes a substrate. A fixing portion is vertically disposed on the substrate and is fixedly connected with the back plate. The support frame is fixedly connected with the substrate. A first protrusion is disposed on the support frame and is inserted into the back plate. The interior of the server chassis is rendered more compact, and the server chassis can accommodate eight hard disks. A server including the server chassis is also disclosed.

16 Claims, 5 Drawing Sheets

SERVER CHASSIS AND SERVER INCLUDING THE SAME

FIELD

The subject matter herein generally relates to a server chassis, in particular to a server chassis and a server including the server chassis.

BACKGROUND

A chassis with a height of 87 mm can only accommodate seven hard disks, three hard disks being stacked in the chassis, the other three hard disks being stacked, and the remaining one hard disk being placed separately. The remaining spacing where the remaining one hard disk is placed in the chassis is only 18.72 mm, which is not big enough to accommodate an eighth hard disk.

BRIEF DESCRIPTION OF THE DRAWINGS

Implementations of the present technology will now be described, by way of embodiment, with reference to the attached figures.

DETAILED DESCRIPTION

The technical solutions in the embodiments of the present disclosure are clearly and completely described in the following with reference to the accompanying drawings in the embodiments of the present disclosure. The described embodiments are only some of the embodiments of the present disclosure, and not all of the embodiments. All other embodiments obtained by those skilled in the art based on the embodiments of the present disclosure without creative efforts are within the scope of the present disclosure.

Unless otherwise defined, all technical and scientific terms used herein have the same meanings as those understood in the art. The terminology used in the description of the present disclosure is for the purpose of describing particular embodiments and is not intended to limit the disclosure.

Embodiments of the present disclosure provide a server chassis. The server chassis includes a housing, a support frame, and a back plate. The housing includes a substrate. A fixing portion is vertically disposed on the substrate. The support frame is fixedly connected with the substrate. A first protrusion is disposed on the support frame and is inserted into the back plate. The back plate is fixedly connected with the fixing portion.

Embodiments of the present disclosure also provide a server including the server chassis.

Figure 1:
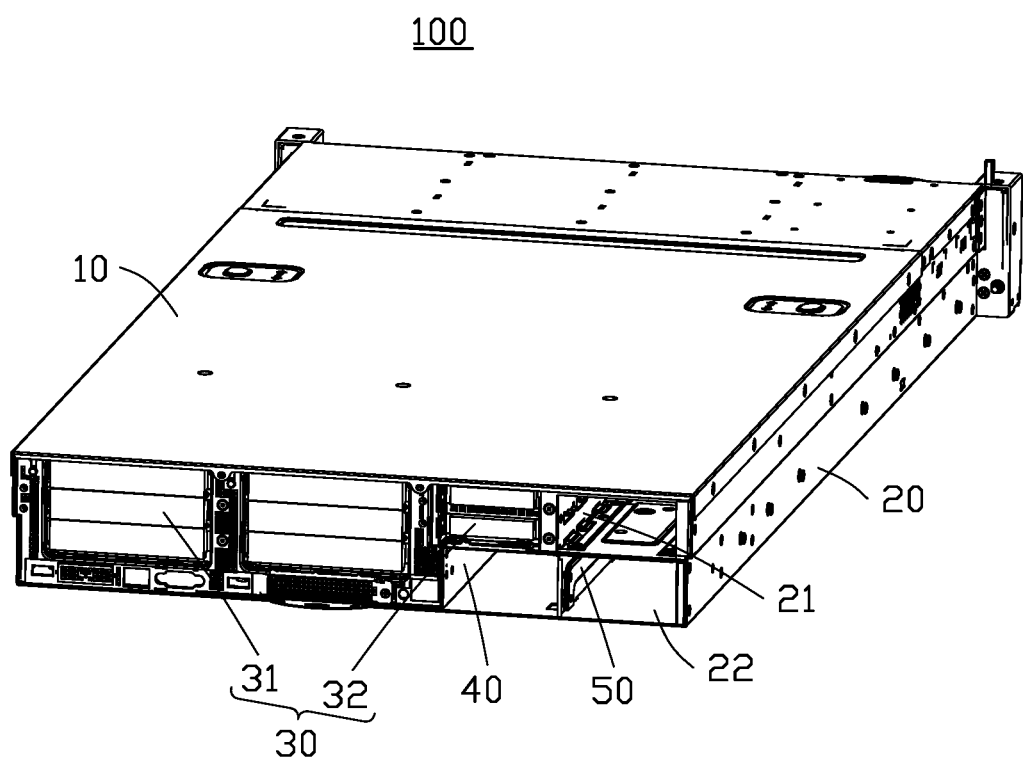
FIG. 1 is a perspective view of a server chassis according to an embodiment of the present disclosure.

Referring to FIG. 1, an embodiment of a server chassis 100 is provided. The server chassis 100 includes a cover 10, a housing 20, a tray assembly 30, a support frame 40, and a back plate 50. The cover 10 and the housing 20 cooperatively form a receiving chamber 21. The tray assembly 30, the support frame 40, and the back plate 50 are accommodated in the receiving chamber 21. The back plate 50 provides support for the support frame 40. The support frame 40 is configured for carrying a part of the tray assembly 30. In one embodiment, the cover 10 and the housing 20 are both substantially rectangular.

Figure 2:
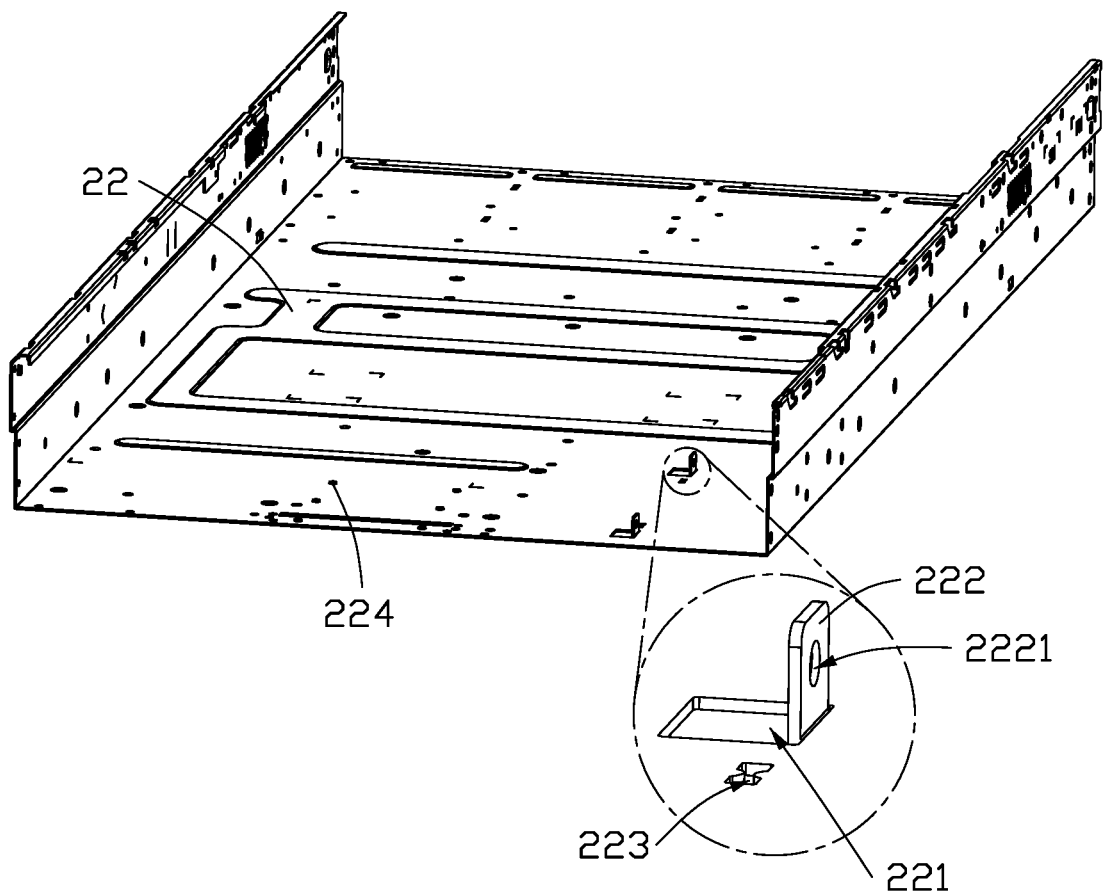
FIG. 2 is a perspective view of a housing of the server chassis of FIG. 1.

Referring to FIGS. 1 and 2, the housing 20 includes a substrate 22. The substrate 22 defines a mounting slot 221 penetrating the substrate 22. When a power assembly is mounted on the substrate 22, heat is dissipated through the mounting slot 221. In one embodiment, and without limitation, the mounting slot 221 may be rectangular.

In one embodiment, a height of the housing 20 is increased from 87 mm to 87.5 mm.

A fixing portion 222 extends from an edge of the mounting slot 221 in a direction perpendicular to the substrate 22. The fixing portion 222 is configured for installing the back plate 50. In one embodiment, there are two mounting slots 221 and two fixing portions 222.

The fixing portion 222 defines a fixing hole 2221 for a fastener (not shown) to pass through. The fixing portion 222 is fixedly connected with the back plate 50 via the fastener. In one embodiment, the fastener is a screw. In one embodiment, the fixing portion 222 and the substrate 22 may be integrally formed. It is to be understood that the fixing portion 222 is not limited to the edge of the mounting slot 221, but can also be disposed at other locations of the substrate 22, as long as the fixing portion 222 is fixedly connected with the back plate 50. Through the arrangements of the fixing portion 222 and the fastener, a thickness between the substrate 22 and the back plate 50 is reduced from 2 mm to 1.2 mm. At the same time, since the height of the housing 20 is increased by 0.5 mm, the spacing which is remaining after installing seven hard disks in the server chassis 100 is increased from 18.72 mm to 20.02 mm, when compared with the existing chassis, which meets the needs of installing an eighth hard disk.

The substrate 22 also defines a clamping slot 223 penetrating the substrate 22. The clamping slot 223 is used to clamp the back plate 50 to further fix the back plate 50. A shape of the clamping slot 223 is matched with a shape of a protruding portion of the back plate 50. In one embodiment, there are two clamping slots 223, the clamping slots 223 are substantially in a shape of a gourd.

The substrate 22 also defines a plurality of matching holes 224. The plurality of matching holes 224 hold parts of the support frame 40 to fixedly connect the support frame 40 with the substrate 22.

Referring to FIG. 1, in one embodiment, the tray assembly 30 includes a plurality of first trays 31 which are disposed in two stacks. In one embodiment, the plurality of first trays 31 are disposed in three rows and two columns. Each of the first trays 31 carries one hard disk (not shown), the six first trays 31 carry six hard disks.

The tray assembly 30 also includes a second tray 32 for carrying the hard disk. The second tray 32 is disposed on the support frame 40. In one embodiment, there are two stacked second trays 32 for carrying two hard disks.

Figure 3:
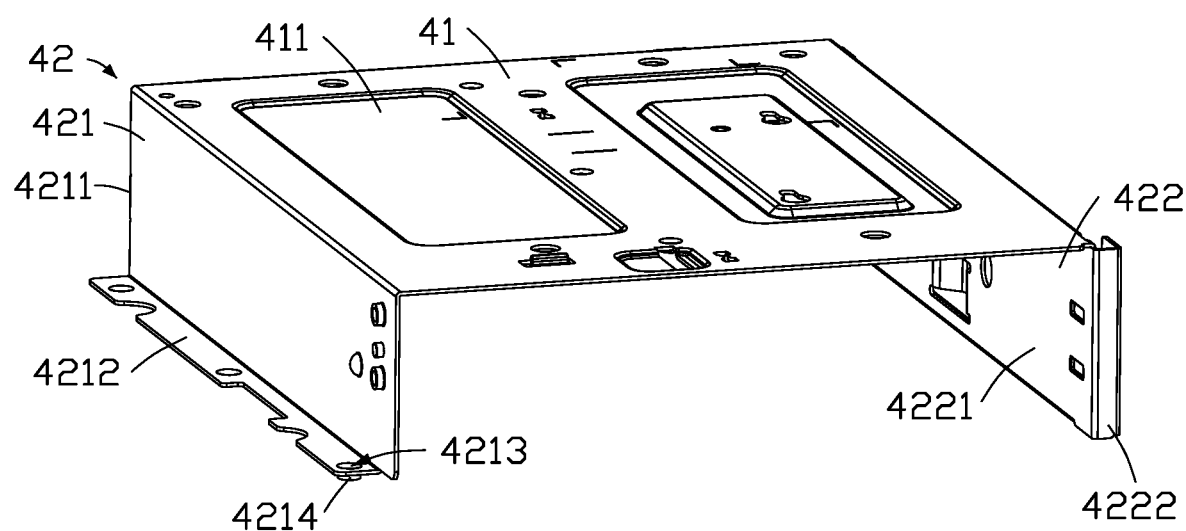
FIG. 3 is a perspective view of a support frame of the server chassis of FIG. 1.

Referring to FIG. 3, the support frame 40 includes a support portion 41 and a connecting mechanism 42 disposed on opposite sides of the support portion 41. The support portion 41 defines a receiving groove 411 for holding the tray assembly 30 or other components inside the server chassis 100. The arrangement of the receiving groove 411 allows better use to be made of the interior of the server chassis 100, thereby saving space.

Figure 4:
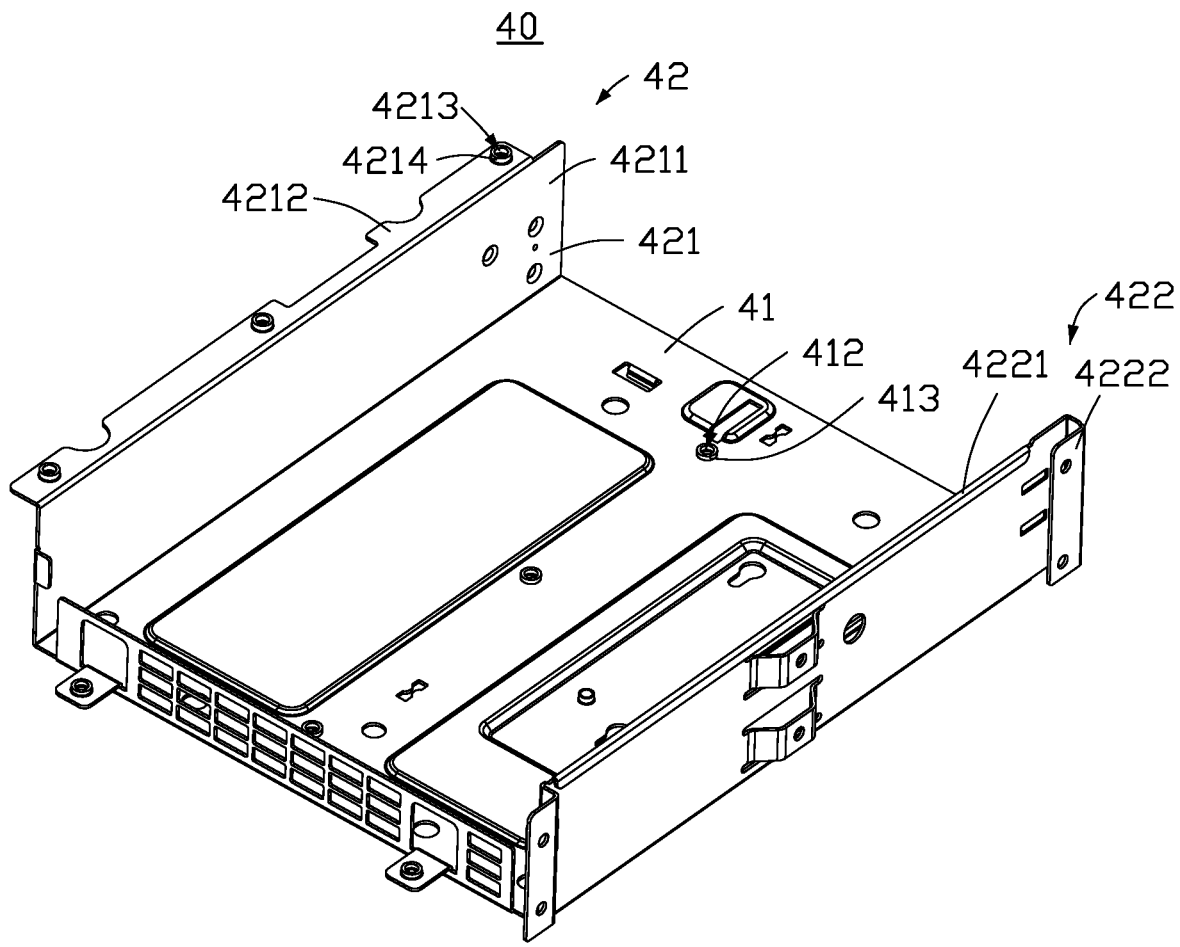
FIG. 4 is similar to FIG. 3, but viewed from another angle.

Referring to FIG. 4, a side of the support portion 41 close to the substrate 22 defines a plurality of first mounting holes 412. The plurality of first mounting holes 412 are used to install fasteners (not shown). The support portion 41 is fixedly connected with an end of the back plate 50 through the fasteners. A first protrusion 413 extends from an edge of each of the plurality of first mounting holes 412. The first protrusion 413 is inserted into the back plate 50 for a closeness and stability in fitting, and to prevent movement of the internal components when the server chassis 100 is shaken or moved. In one embodiment, the first protrusion 413 is substantially annular.

Referring to FIGS. 3 and 4, the connecting mechanism 42 includes a first connecting portion 421 and a second connecting portion 422. The first connecting portion 421 and the second connecting portion 422 are disposed on opposite sides of the support portion 41. The first connecting portion 421 and the second connecting portion 422 are substantially perpendicular to the support portion 41.

The first connecting portion 421 includes a first resisting member 4211 and a first mounting member 4212. The first resisting member 4211 is perpendicular to the first resisting member 4211 and an end of the support portion 41. The first mounting member 4212 and the support portion 41 are disposed on opposite sides of the first resisting member 4211. The first mounting member 4212 is used to abut against other components inside the server chassis 100 to fix the other components inside the server chassis 100. It is to be understood that the other components inside the server chassis 100 may include a power assembly, a fan assembly, etc.

The first mounting member 4212 is fixed to the substrate 22. The first mounting member 4212 defines a plurality of second mounting holes 4213 for fasteners (not shown) to pass through, so that the support frame 40 is fixedly connected with the substrate 22. In one embodiment, the fasteners are screws. A second protrusion 4214 extends from an edge of each of the second mounting holes 4213. The second protrusion 4214 is accommodated in one of the matching holes 224 to make the connection between the first mounting member 4212 and the substrate 22 more stable, and to prevent movement of the internal components when the server chassis 100 is shaken. In one embodiment, the second protrusion 4214 is substantially annular.

The second connecting portion 422 includes a second resisting member 4221 and two second mounting members 4222 which are folded and extend from opposite ends of the second resisting member 4221. The second resisting member 4221 is used to abut against other components inside the server chassis 100 to fix the other components inside the server chassis 100. The two second mounting members 4222 are located on a side of the second resisting member 4221 away from the first resisting member 4211 and are used to connect with the housing 20. In one embodiment, the second mounting members 4222 are substantially L-shaped.

Figure 5:
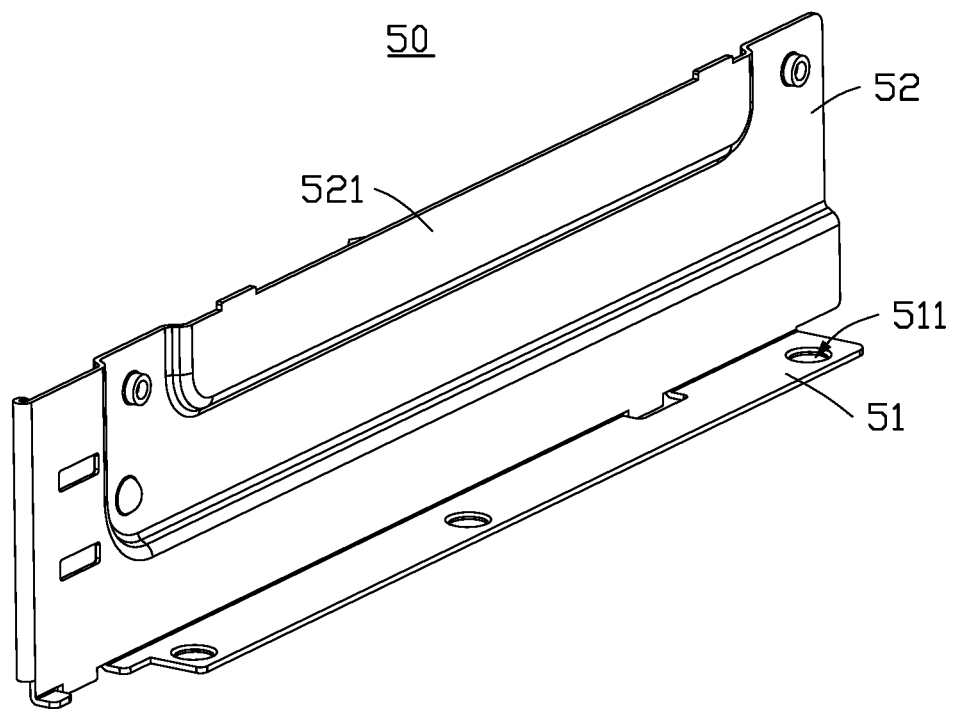
FIG. 5 is a perspective view of a back plate of the server chassis of FIG. 1.

Referring to FIG. 5, the back plate 50 includes a supporting member 51 and a connecting member 52 vertically connected with the supporting member 51. The supporting member 51 defines a plurality of through holes 511 for holding the plurality of first protrusions 413 to make a firmer connection between the support frame 40 and the back plate 50. In one embodiment, the supporting member 51 is disposed in the middle of the support portion 41 to support the support frame 40. The connecting member 52 is perpendicular to the support portion 41 and defines a groove 521. The groove 521 is configured to abut against the other components inside the server chassis 100 to fix the other components in place.

An embodiment of the present disclosure also provides a server, the server includes the above server chassis 100.

In the server chassis 100 and the server, the height of the housing 20 is increased, the fixing portion 222 is vertically arranged on the substrate 22 and is fixedly connected with the support frame 40 to reduce the height between the substrate 22 and the back plate 50. The first protrusion 413 is disposed on the support frame 40 to make the support frame 40 be closely connected with the back plate 50. The interior of the server chassis 100 is thus rendered more compact, and the server chassis 100 can accommodate eight hard disks.

While the present disclosure has been described with reference to particular embodiments, the description is illustrative of the disclosure and is not to be construed as limiting the disclosure. Therefore, those of ordinary skill in the art can make various modifications to the embodiments without departing from the scope of the disclosure as defined by the appended claims.

What is claimed is:

1. A server chassis comprising:
a housing comprising a substrate, wherein a fixing portion is vertically disposed on the substrate;
a support frame fixedly connected with the substrate, wherein a first protrusion is disposed on the support frame; and
a back plate fixedly connected with the fixing portion, wherein the first protrusion is inserted into the back plate;
wherein the support frame comprises a support portion, a first connecting portion disposed on a side of the support portion, and a second connecting portion disposed on a side of the support portion away from the first connecting portion, the first connecting portion comprises a first resisting member and a first mounting member, the first resisting member is perpendicular to the first mounting member and an end of the support portion, the first mounting member and the support portion are disposed on opposite sides of the first resisting member, the first mounting member defines a plurality of mounting holes for fasteners to pass through to connect the support frame with the substrate, the second connecting portion comprises a second resisting member and two second mounting members which are folded and extend from opposite ends of the second resisting member, the two second mounting members are located on a side of the second resisting member away from the first resisting member and are fixedly connected with the housing.

2. The server chassis of claim 1, wherein the substrate defines a mounting slot penetrating the substrate.

3. The server chassis of claim 1, wherein the substrate defines a clamping slot penetrating the substrate, the clamping slot is engaged with the back plate.

4. The server chassis of claim 1, further comprising a tray assembly accommodated in the housing, wherein the tray assembly is configured to carry hard disks.

5. The server chassis of claim 4, wherein the support portion defines a receiving groove for holding the tray assembly or other components inside the server chassis.

6. The server chassis of claim 1, wherein the server chassis comprises a plurality of first protrusions disposed on the support frame, the back plate comprises a supporting member defining a plurality of through holes for accommodating the plurality of first protrusions.

7. The server chassis of claim 6, wherein the back plate further comprises a connecting member perpendicular to the supporting member and the support portion, the connecting member defines a groove for accommodating the other components inside the server chassis.

8. The server chassis of claim 1, wherein a second protrusion is disposed on the first mounting member, the substrate further defines a matching hole, the second protrusion is accommodated in the matching hole.

9. A server comprising a server chassis, wherein the server chassis comprises:
- a housing comprising a substrate, wherein a fixing portion is vertically disposed on the substrate;
- a support frame fixedly connected with the substrate, wherein a first protrusion is disposed on the support frame; and
- a back plate fixedly connected with the fixing portion, wherein the first protrusion is inserted into the back plate;

wherein the support frame comprises a support portion, a first connecting portion disposed on a side of the support portion, and a second connecting portion disposed on a side of the support portion away from the first connecting portion, the first connecting portion comprises a first resisting member and a first mounting member, the first resisting member is perpendicular to the first mounting member and an end of the support portion, the first mounting member and the support portion are disposed on opposite sides of the first resisting member, the first mounting member defines a plurality of mounting holes for fasteners to pass through to connect the support frame with the substrate, the second connecting portion comprises a second resisting member and two second mounting members which are folded and extend from opposite ends of the second resisting member, the two second mounting members are located on a side of the second resisting member away from the first resisting member and are fixedly connected with the housing.

10. The server of claim 9, wherein the substrate defines a mounting slot penetrating the substrate.

11. The server of claim 9, wherein the substrate defines a clamping slot penetrating the substrate, the clamping slot is engaged with the back plate.

12. The server of claim 9, wherein the server chassis further comprises a tray assembly accommodated in the housing, the tray assembly is configured to carry hard disks.

13. The server of claim 12, wherein the support portion defines a receiving groove for holding the tray assembly or other components inside the server chassis.

14. The server of claim 9, wherein the server chassis comprises a plurality of first protrusions disposed on the support frame, the back plate comprises a supporting member defining a plurality of through holes for accommodating the plurality of first protrusions.

15. The server of claim 14, wherein the back plate further comprises a connecting member perpendicular to the supporting member and the support portion, the connecting member defines a groove for accommodating the other components inside the server chassis.

16. The server of claim 9, wherein a second protrusion is disposed on the first mounting member, the substrate further defines a matching hole, the second protrusion is accommodated in the matching hole.

\* \* \* \* \*